(12) United States Patent
Takasu et al.

(10) Patent No.: US 7,667,280 B2
(45) Date of Patent: Feb. 23, 2010

(54) SEMICONDUCTOR DEVICE

(75) Inventors: Hiroaki Takasu, Chiba (JP); Naoto Inoue, Chiba (JP); Sukehiro Yamamoto, Chiba (JP)

(73) Assignee: Seiko Instruments Inc., Chiba (JP)

( * ) Notice: Subject to any disclaimer, the term of this patent is extended or adjusted under 35 U.S.C. 154(b) by 64 days.

(21) Appl. No.: 12/030,294

(22) Filed: Feb. 13, 2008

(65) Prior Publication Data
US 2008/0191308 A1 Aug. 14, 2008

(30) Foreign Application Priority Data
Feb. 13, 2007 (JP) .............................. 2007-032034

(51) Int. Cl.
*H01L 29/76* (2006.01)
*H01L 29/94* (2006.01)
*H01L 31/062* (2006.01)

(52) U.S. Cl. ............... 257/409; 257/501; 257/E27.009; 257/E29.255

(58) Field of Classification Search ................. 257/501, 257/E27.009, 409, E29.255
See application file for complete search history.

(56) References Cited

U.S. PATENT DOCUMENTS

2005/0088556 A1* 4/2005 Han ........................... 348/308
2008/0150055 A1* 6/2008 Kim ........................... 257/432

FOREIGN PATENT DOCUMENTS

JP 2000-58673 A 2/2000

* cited by examiner

*Primary Examiner*—David S Blum
(74) *Attorney, Agent, or Firm*—Brinks Hofer Gilson & Lione

(57) ABSTRACT

Provided is a semiconductor device having a trench isolation structure and a high power supply voltage circuit section including at least a well region and a MOS transistor formed therein. The high power supply voltage circuit section includes a carrier capture region for preventing latch-up in a vicinity of an end portion of the well region, and a depth of the carrier capture region is larger than a depth of the trench isolation region. The carrier capture region in the high power supply voltage circuit section is formed of a diffusion layer which is the same as that of a source or a drain region of the MOS transistor formed in the high power supply voltage circuit section.

8 Claims, 2 Drawing Sheets

SEMICONDUCTOR DEVICE

REFERENCE TO THE RELATED APPLICATIONS

This application claims priority under 35 U.S.C. §119 to Japanese Patent Application No. JP2007-032034 filed Feb. 13, 2007, the entire content of which is hereby incorporated by reference.

BACKGROUND OF THE INVENTION

1. Field of the Invention

The present invention relates to a semiconductor device having a trench isolation structure. More particularly, the present invention relates to a semiconductor device such as a CMOS device having multiple power supply voltages and using trench isolation for element isolation structure.

2. Description of the Related Art

In a semiconductor device having CMOS devices which use multiple power supply voltages, it is important to improve degree of integration of low power supply voltage sections forming an internal circuit such as a logic circuit and, at the same time, to secure latch-up resistance of high power supply voltage sections used for input/output circuits or the like.

Element isolation is often carried out by trench isolation method which is more suitable for higher integration than LOCOS method. However, in a semiconductor device whose element isolation is carried out by trench isolation, in order to secure enough latch-up resistance for high power supply voltage circuit sections, it is necessary to increase the depth of a well to suppress parasitic bipolar action, and, in order to reduce leakage current between an NMOS transistor and a PMOS transistor and to secure high voltage withstanding characteristics, it is necessary to make the isolation width of a trench isolation portion larger. Accordingly, there is a problem that, when the low power supply voltage circuit sections use the same trench isolation as that of the high power supply voltage circuit sections, the degree of integration of elements reduces in the low power supply voltage sections to which high degree of integration is required.

As measures for improvement thereof, a method of making the depth of a well in the high power supply voltage circuit section larger than that of a well in the low power supply voltage circuit section and making the width of a trench isolation portion in the high power supply voltage circuit section larger than that of a trench isolation portion in the low power supply voltage circuit section is proposed (see Japanese Patent Laid-open Application JP2000-58673A, for example).

As described above, in a semiconductor device which uses multiple power supply voltages where element isolation is carried out by trench isolation, in order to secure enough latch-up resistance for a high power supply voltage circuit section, it is necessary to increase the depth of a well to suppress parasitic bipolar action, and, in order to reduce leakage current between an NMOS transistor and a PMOS transistor and to secure high voltage withstanding characteristic, it is necessary to make the width of a trench isolation portion larger. Accordingly, there is a problem that, when the low power supply voltage circuit section uses the same trench isolation as that of the high power supply voltage circuit section, the degree of integration of elements reduces in the low power supply voltage section to which high degree of integration is required.

The examples in which the depth of a well in the high power supply voltage circuit section is made larger than that of a well in the low power supply voltage circuit section and the width of a trench isolation portion in the high power supply voltage circuit section is made larger than that in the low power supply voltage circuit section have been proposed, however, there are problems that the number of the manufacturing steps increases and that the increase in the width of a trench isolation portion leads to increase in cost.

SUMMARY OF THE INVENTION

In order to solve the above problems, according to the present invention, a semiconductor device is structured as in the following.

The semiconductor device includes: a high power supply voltage circuit section; a low power supply voltage circuit section; and a trench isolation structure in which element isolation in the high power supply voltage circuit section and the low power supply voltage circuit section is carried out by a trench isolation region, the high power supply voltage circuit section including at least one well region and at least one MOS transistor formed therein, in which the high power supply voltage circuit section includes a carrier capture region for preventing latch-up in a vicinity of an end portion of the well region, and a depth of the carrier capture region is larger than a depth of the trench isolation region.

Further, the carrier capture region in the high power supply voltage circuit section is formed of a diffusion layer which is the same as that of one of a source and a drain region of the at least one MOS transistor formed in the high power supply voltage circuit section.

According to the present invention, As described above, a semiconductor device can be obtained in which the number of the manufacturing steps is not increased, enough latch-up resistance is secured for the high power supply voltage circuit section, the low power supply voltage circuit section uses the same trench isolation structure as that of the high power supply voltage circuit section, and still, the degree of integration is high.

DETAILED DESCRIPTION OF THE PREFERRED EMBODIMENTS

Embodiment 1

Figure 1:
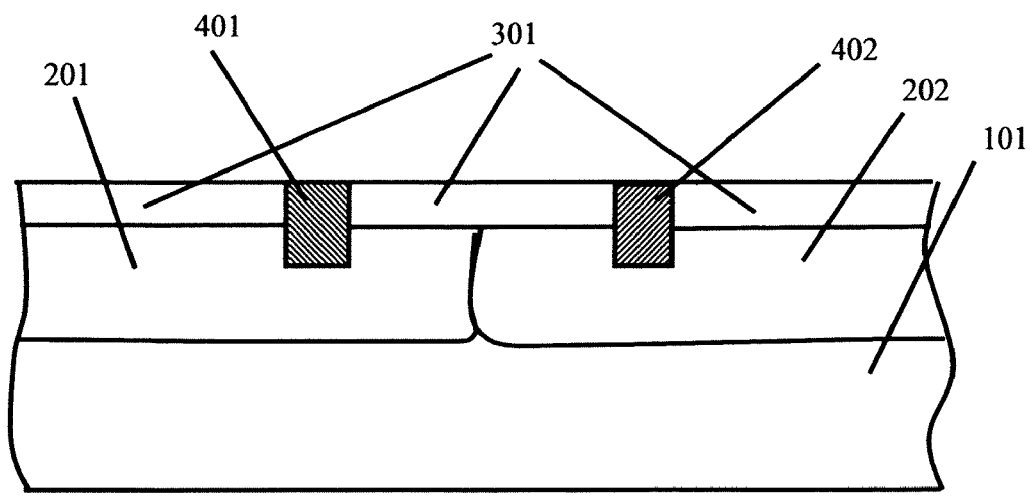
FIG. 1 is a schematic sectional view illustrating a first embodiment of a semiconductor device according to the present invention.

FIG. 1 is a schematic sectional view illustrating a first embodiment of a high power supply voltage circuit section in a semiconductor device according to the present invention.

A P-type well region 201 which is a low concentration P-type impurity region as a first well and an N-type well region 202 which is a low concentration N-type impurity region as a second well are formed so as to be adjacent to each other on a P-type silicon substrate 101 as a semiconductor substrate of a first conductivity type. A plurality of MOS transistors (not shown) is formed on surfaces of the wells, and a trench isolation region 301 for isolating the MOS transistors is formed. A part of the trench isolation region 301 in the P-type well region 201 in the vicinity of a junction between the P-type well region 201 and the N-type well region 202 is removed and a carrier capture region 401 which is a high concentration P-type impurity region and has the depth larger than that of the trench isolation region 301 is formed. A part of the trench isolation region 301 in the N-type well region 202 is also removed and a carrier capture region 402 which is a high concentration N-type impurity region and has the depth larger than that of the trench isolation region 301 is formed.

Because the carrier capture region 401 which is a high concentration P-type impurity region and the carrier capture region 402 which is a high concentration N-type impurity region, each of which has the depth larger than that of the trench isolation region 301, are formed, latch-up caused by triggers such as surges from the outside and voltage fluctuations due to internal circuit operation can be effectively prevented between the P-type well region 201, the N-type well region 202, the P-type silicon substrate 101, and a source or drain region of the MOS transistors (not shown) which are formed in the P-type well region 201 or in the N-type well region 202.

The carrier capture region 401 which is a high concentration P-type impurity region in the P-type well region 201 is formed of an impurity diffusion layer which is the same as that of the source or drain region of the P-type MOS transistors (not shown) which are formed in the N-type well region 202. Similarly, the carrier capture region 402 which is a high concentration N-type impurity region in the N-type well region 202 is formed of an impurity diffusion layer which is the same as that of the source or drain region of the N-type MOS transistors (not shown) which are formed in the P-type well region 201.

This makes it possible to form with ease the carrier capture region 401 which is a high concentration P-type impurity region and the carrier capture region 402 which is a high concentration N-type impurity region for preventing latch-up without specifically increasing the number of the manufacturing steps.

In the embodiment illustrated in FIG. 1, the P-type silicon substrate is the semiconductor substrate of the first conductivity type, the P-type well is the first well, and the N-type well is the second well, however, an N-type silicon substrate may be the semiconductor substrate of the first conductivity type, an N-type well may be the first well, and a P-type well may be the second well.

It should be noted that, in a low power supply voltage circuit section (not shown) of the semiconductor device according to the present invention, because the operating voltage is low, parasitic bipolar action and latch-up are less likely to occur. Accordingly, a carrier capture region having the depth larger than that of the trench isolation region which is described above is not necessary, and thus, a higher degree of integration can be realized.

As described above, according to the present invention, a semiconductor device can be obtained in which the number of the manufacturing steps does not increase, enough latch-up resistance is secured for the high power supply voltage circuit section, the low power supply voltage circuit section uses the same trench isolation as that of the high power supply voltage circuit section, and still, the degree of integration is high.

Embodiment 2

Figure 2:
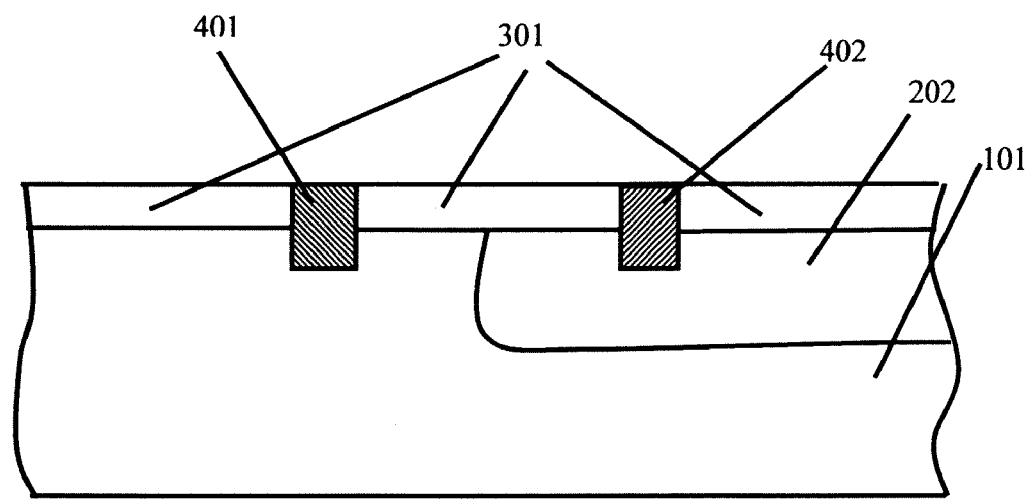
FIG. 2 is a schematic sectional view illustrating a second embodiment of a semiconductor device according to the present invention.

FIG. 2 is a schematic sectional view illustrating a second embodiment of a high power supply voltage circuit section in a semiconductor device according to the present invention.

An N-type well region 202 which is a low concentration N-type impurity region as a second well is formed on a P-type silicon substrate 101 as a semiconductor substrate of a first conductivity type. A plurality of MOS transistors (not shown) is formed on their surfaces, and a trench isolation region 301 for isolating the MOS transistors is formed. A part of the trench isolation region 301 in the P-type silicon substrate 101 in the vicinity of a junction between the P-type silicon substrate 101 and the N-type well region 202 is removed and a carrier capture region 401 which is a high concentration P-type impurity region and has the depth larger than that of the trench isolation region 301 is formed. A part of the trench isolation region 301 in the N-type well region 202 is also removed and a carrier capture region 402 which is a high concentration N-type impurity region and has the depth larger than that of the trench isolation region 301 is formed.

Because the carrier capture region 401 which is a high concentration P-type impurity region and the carrier capture region 402 which is a high concentration N-type impurity region, each of which has the depth larger than that of the trench isolation region 301, are formed, latch-up caused by triggers such as surges from the outside and voltage fluctuations due to internal circuit operation can be effectively prevented between the N-type well region 202, the P-type silicon substrate 101, and a source or drain region of the MOS transistors (not shown) which are formed in the P-type silicon substrate 101 or in the N-type well region 202.

The carrier capture region 401 which is a high concentration P-type impurity region in the P-type silicon substrate 101 is formed of an impurity diffusion layer which is the same as that of the source or drain region of the P-type MOS transistors (not shown) which are formed in the N-type well region 202. Similarly, the carrier capture region 402 which is a high concentration N-type impurity region in the N-type well region 202 is formed of an impurity diffusion layer which is the same as that of the source or drain region of the N-type MOS transistors (not shown) which are formed in the P-type silicon substrate 101.

This makes it possible to form with ease the carrier capture region 401 which is a high concentration P-type impurity region and the carrier capture region 402 which is a high concentration N-type impurity region for preventing latch-up without specifically increasing the number of the manufacturing steps.

In the embodiment illustrated in FIG. 2, the P-type silicon substrate is the semiconductor substrate of the first conductivity type and the N-type well is the second well, however, an N-type silicon substrate may be the semiconductor substrate of the first conductivity type and a P-type well may be the second well. In this figure, like numerals are used to designate like or identical members illustrated in FIG. 1, and description thereof is omitted.

Embodiment 3

Figure 3:
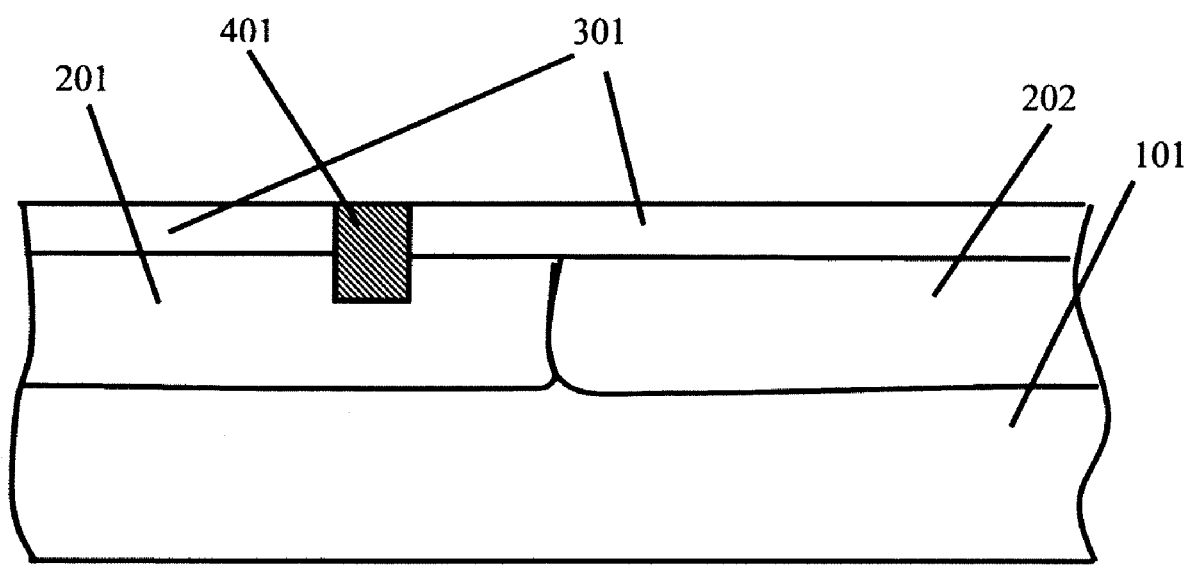
FIG. 3 is a schematic sectional view illustrating a third embodiment of a semiconductor device according to the present invention.

FIG. 3 is a schematic sectional view illustrating a third embodiment of a high power supply voltage circuit section in a semiconductor device according to the present invention.

A P-type well region 201 which is a low concentration P-type impurity region as a first well and an N-type well region 202 which is a low concentration N-type impurity region as a second well are formed so as to be adjacent to each other on a P-type silicon substrate 101 as a semiconductor substrate of a first conductivity type. A plurality of MOS transistors (not shown) is formed on their surfaces, and a trench isolation region 301 for isolating the MOS transistors is formed. A part of the trench isolation region 301 in the P-type well region 201 in the vicinity of a junction between the P-type well region 201 and the N-type well region 202 is removed and a carrier capture region 401 which is a high concentration P-type impurity region and has the depth larger than that of the trench isolation region 301 is formed.

This embodiment differs from the embodiment illustrated in FIG. 1 in that, while, in the embodiment illustrated in FIG. 1, both the carrier capture region 401 formed in the P-type well region 201 and the carrier capture region 402 which is a high concentration N-type impurity region formed in the N-type well region 202 are provided, in the embodiment illustrated in FIG. 3, only the carrier capture region 401 which is a high concentration P-type impurity region in the P-type well region 201 is formed.

From the viewpoint of preventing latch-up, it is desirable to provide both the carrier capture region 401 which is a high concentration P-type impurity region and the carrier capture region 402 which is a high concentration N-type impurity region formed in the P-type well region 201 and the N-type well region 202, respectively, as illustrated in FIG. 1. However, when the occupied area is required to be as small as possible or when enough latch-up resistance can be secured, it is also possible to form one of the carrier capture region 401 which is a high concentration P-type impurity region in the P-type well region 201 and the carrier capture region 402 which is a high concentration N-type impurity region in the N-type well region 202 which is more effective.

In the embodiment illustrated in FIG. 3, both the P-type well region 201 and the N-type well region 202 are provided, when, as illustrated in FIG. 2, there is only the second well on the semiconductor substrate of the first conductivity type, a similar effect can be obtained by forming one of the carrier capture region 401 which is a high concentration P-type impurity region in the semiconductor substrate of the first conductivity type and the carrier capture region 402 which is a high concentration N-type impurity region in the second well.

Reference is made again to FIG. 3. Because the carrier capture region 401 having the depth larger than that of the trench isolation region 301 is formed, latch-up caused by triggers such as surges from the outside and voltage fluctuations due to internal circuit operation can be effectively prevented between the P-type well region 201, the N-type well region 202, the P-type silicon substrate 101, and a source or drain region of the MOS transistors (not shown) which are formed in the P-type well region 201 or in the N-type well region 202.

The carrier capture region 401 which is a high concentration P-type impurity region in the P-type well region 201 is formed of an impurity diffusion layer which is the same as that of the source or drain region of the P-type MOS transistors (not shown) which are formed in the N-type well region 202. This makes it possible to form with ease the carrier capture region 401 which is a high concentration P-type impurity region for preventing latch-up without specifically increasing the number of the manufacturing steps.

In the embodiment illustrated in FIG. 3, the P-type silicon substrate is the semiconductor substrate of the first conductivity type, the P-type well is the first well, and the N-type well is the second well, however, an N-type silicon substrate may be the semiconductor substrate of the first conductivity type, an N-type well may be the first well, and a P-type well may be the second well. In this figure, like numerals are used to designate like or identical members illustrated in FIG. 1, and description thereof is omitted.

As described above, according to the present invention, a semiconductor device can be obtained in which the number of the manufacturing steps is not increased, enough latch-up resistance is secured for the high power supply voltage circuit section, the low power supply voltage circuit section uses the same trench isolation structure as that of the high power supply voltage circuit section, and still, the degree of integration is high.

What is claimed is:

1. A semiconductor device comprising:
   a high power supply voltage circuit section including a semiconductor substrate, a well region arranged in the semiconductor substrate, and a MOS transistor formed in the well region;
   a low power supply voltage circuit section; and
   a trench isolation structure in which element isolation in the high power supply voltage circuit section and the low power supply voltage circuit section is carried out by a trench isolation region;
   wherein the high power supply voltage circuit section includes a carrier capture region for preventing latch-up in a vicinity of an end portion of the well region, and a depth of the carrier capture region is larger than a depth of the trench isolation region;
   wherein a conductivity type of the carrier capture region is identical to the conductivity type of the well region within which the carrier capture region is present.

2. A semiconductor device according to claim 1,
   wherein the semiconductor substrate has a first conductivity type and the well region comprises a first well of the first conductivity type and a second well of a second conductivity type, and
   wherein the carrier capture region is present in each of an end portion of the first well and an end portion of the second well in a vicinity of a junction between the first well and the second well.

3. A semiconductor device according to claim 1,
   wherein the semiconductor substrate has a first conductivity type; and the well region comprises a selected well of a second conductivity type, and
   wherein the carrier capture region is present in each of the semiconductor substrate of the first conductivity type and the selected well in a vicinity of a junction between the semiconductor substrate of the first conductivity type and the selected well.

4. A semiconductor device according to claim 1, wherein the semiconductor substrate has a first conductivity type, and the well region comprises a first well of the first conductivity type and a second well of a second conductivity type, and
   wherein the carrier capture region is present only in an end portion of the first well in a vicinity of a junction between the first well and the second well has the carrier capture region.

5. A semiconductor device according to claim 1,
   wherein the semiconductor substrate has a first conductivity type and the well region comprises a first well of the first conductivity types and a second well of a second conductivity type, and
   wherein the carrier capture region is present only in an end portion of the second well in a vicinity of a junction between the first well and the second well has the carrier capture region.

6. A semiconductor device according to claim 1,
wherein the semiconductor substrate has a first conductivity type and the well region comprises a selected well of a second conductivity type, and
wherein the carrier capture region is present only in a side of the semiconductor substrate of the first conductivity type in a vicinity of a junction between the semiconductor substrate of the first conductivity type and the selected well.

7. A semiconductor device according to claim 1,
wherein the semiconductor substrate has a first conductivity types and the well region comprises a selected well of a second conductivity type, and
wherein the carrier capture region is present only in a side of the second well in a vicinity of a junction between the semiconductor substrate of the first conductivity type and the selected well.

8. A semiconductor device according to claim 1, wherein the carrier capture region in the high power supply voltage circuit section is formed of a diffusion layer which is the same as that of one of a source and a drain region of the MOS transistor formed in the high power supply voltage circuit section.

* * * * *